United States Patent [19]

Tamura

[11] Patent Number: 5,616,947

[45] Date of Patent: Apr. 1, 1997

[54] SEMICONDUCTOR DEVICE HAVING AN MIS STRUCTURE

[75] Inventor: Akiyoshi Tamura, Suita, Japan

[73] Assignee: Matsushita Electric Industrial Co., Ltd., Kadoma, Japan

[21] Appl. No.: 651,322

[22] Filed: May 31, 1996

Related U.S. Application Data

[63] Continuation of Ser. No. 380,122, Jan. 30, 1995.

[30] Foreign Application Priority Data

Feb. 1, 1994 [JP] Japan .................................. 6-010246
Sep. 28, 1994 [JP] Japan .................................. 6-233833

[51] Int. Cl.$^6$ .................................................. H01L 29/78
[52] U.S. Cl. .................... 257/410; 257/631; 257/632; 257/289
[58] Field of Search .................................. 257/744, 192, 257/200, 289, 410, 630–632

[56] References Cited

U.S. PATENT DOCUMENTS 4,859,253  8/1989  Buchanan et al. ................... 148/33.3
5,294,818  3/1994  Fujita et al. ............................ 257/200

FOREIGN PATENT DOCUMENTS 60-177618   9/1985  Japan .
60-227416  11/1985  Japan .
4-352330   12/1992  Japan .

*Primary Examiner*—Sara W. Crane
*Assistant Examiner*—David B. Hardy
*Attorney, Agent, or Firm*—Renner, Otto, Boisselle & Sklar

[57] ABSTRACT

A semiconductor device including a GaAs semiconductor substrate, an insulating layer which is made of material selected from the group MgS, MgSSe and CaZnS and is formed on the GaAs substrate, and a conductive electrode formed on the insulating layer.

6 Claims, 13 Drawing Sheets

5,616,947

SEMICONDUCTOR DEVICE HAVING AN MIS STRUCTURE

This application is a continuation of copending application(s) Ser. No. 08/380,122 filed on Jan. 30, 1995, now abandoned.

BACKGROUND OF THE INVENTION

1. Field of the Invention

The present invention relates to a metal—insulator—semiconductor (MIS) type semiconductor device using a compound semiconductor and a method for fabricating the same, and more particularly relates to an MIS type semiconductor device using a GaAs semiconductor and a method for fabricating the same.

2. Description of the Related Art

As an MIS type semiconductor device using a compound semiconductor substrate made of GaAs, various types of devices have been proposed. In the proposed MIS type semiconductor devices, silicon oxide ($SiO_2$), silicon nitride ($Si_3N_4$), aluminum oxide ($Al_2O_3$) or the like is used as an insulating layer. Moreover, the use of an oxide film which is obtained by oxidizing a GaAs substrate with plasma or a semiconductor layer made of AlGaAs as an insulating layer has been reported.

However, in an MIS type semiconductor device using such a conventional insulating layer, an interface state having a density of $10^{12} cm^{-2} eV^{-1}$ or more occurs on a surface of the GaAs substrate in contact with the insulating layer. The interface state exists because a large number of surface states, which are generated by donors or acceptors, are present on the surface of the substrate. The donors are generated since As atoms ($As_{Ga}$) are positioned at Ga lattice sites on the surface of the GaAs substrate, and the acceptors are generated since Ga atoms ($Ga_{As}$) are positioned at As lattice sites on the surface of the GaAs substrate. If electrons or holes are trapped in the thus generated interface state, it becomes difficult to form an inversion layer which plays an important part for operating as an MIS semiconductor device in the GaAs substrate.

On the other hand, since the density of the interface state generated on the surface of the GaAs substrate in a conventional MIS type semiconductor device using an AlGaAs semiconductor is reduced to that on the surface of the silicon semiconductor substrate of the MOS type semiconductor device, it is expected that an MIS semiconductor device having excellent characteristics can be fabricated by using AlGaAs. However, since the maximum value of the energy gap of AlGaAs is about 2 eV, a leak current increases in accordance with the increase in a bias voltage. Therefore, an MIS type semiconductor device using an AlGaAs semiconductor may not be applied with a larger operation voltage than that applied to a conventional MOS type semiconductor device.

Thus, a conventional MIS type semiconductor device using the GaAs Substrate is not suitable for practical use as a product.

The present invention can solve the above problems, and its objective is to provide an MIS type semiconductor device having excellent characteristics as a device by forming a boundary of GaAs/insulating layer having a low interface state density and a method for fabricating the same.

SUMMARY OF THE INVENTION

A method for fabricating a semiconductor device of this invention, includes the steps of:

exposing a surface of a GaAs substrate to an ozone ($O_3$) gas atmosphere while radiating a ultraviolet ray thereon so as to oxidize the surface region of the GaAs substrate, thereby forming an oxide layer on the surface of the GaAs substrate;

annealing the GaAs Substrate in an ammonia gas atmosphere so as to change the oxide layer into a nitride layer; and forming a conductive electrode on the nitride layer.

According to one aspect to the invention, a method for fabricating a semiconductor device, includes the steps of:

treating a surface of a GaAs substrate with an ammonium sulfide solution;

forming an aluminum film on The surface of the GaAs substrate;

annealing the GaAs substrate in an ammonia gas atmosphere to oxidize the aluminum film so as to change the Al film into an AlN film; and forming a conductive electrode on the AlN film.

According to another aspect of the present invention, a method for fabricating a semiconductor device, includes the steps of:

epitaxially growing an InP layer having a thickness equal to or less than a critical thickness on a surface of a GaAs substrate;

forming an insulating layer on the InP layer; and forming a conductive electrode on the insulating layer.

According to still another aspect of the present invention, a method for fabricating a semiconductor device, includes the steps of:

immersing a GaAs substrate into an ammonium sulfide solution in which at least one kind of component constituting an insulating layer is dissolved and allowing a current to flow across the GaAs substrate by using a counter electrode immersed into the ammonium sulfide solution so as to electrodeposit the insulating layer containing the at least one kind of component on the surface of the GaAs substrate; and forming a conductive electrode on the insulating layer.

In one embodiment of the invention, the insulating layer is electrodeposited by using the GaAs substrate as an anode.

In another aspect of the invention, the component is an organic compound containing sulfur atoms, and the insulating layer is made of an organic compound containing sulfur.

In still another aspect of the invention, the insulating layer is electrodeposited by using the GaAs substrate as a cathode.

In still another aspect of the invention, the component contains magnesium, and the insulating layer is made of MgS.

In still another aspect of the invention, the component contains magnesium and selenium, and the insulating layer is made of MgSSe.

In still another aspect of the invention, the component contains calcium and zinc, and the insulating layer is made of CaZnS.

Alternatively, a method of the invention for fabricating a semiconductor device, includes the steps of:

epitaxially growing an insulating layer made of material selected from a group of MgS, MgSSe and CaZnS on a GaAs substrate; and forming a conductive electrode on the insulating layer.

In one embodiment of the invention, the surface of the GaAs substrate is treated with an $H_2S$ gas or an $H_2Se$ gas before carrying out the step of epitaxially growing the insulating layer.

In another aspect of the invention, the semiconductor layer is formed by a metalorganic vapor deposition (MOCVD) method.

In still another aspect of the invention, the semiconductor layer is formed by a molecular beam epitaxy (MBE) method.

A semiconductor device of this invention includes:

a GaAs semiconductor substrate;

an insulating layer which is made of material selected from a Group of MGS, MgSSe and CaZnS and formed on the GaAs substrate; and a conductive electrode formed on the insulating layer.

In one embodiment of the invention, an inversion layer is formed in the GaAs semiconductor layer in accordance with a voltage applied to the conductive electrode.

In another aspect of the invention, a semiconductor device further includes a source electrode and a drain electrode formed on the GaAs semiconductor layer, wherein a current flows across the source electrode and the drain electrode through the inversion layer.

According to the present invention, a boundary of GaAs/GaN can be formed inside an original surface of a GaAs substrate by oxidizing the surface of the GaAs substrate with ozone and further changing the formed oxide film into a nitride layer with an ammonia gas. Moreover, as having a large band Gap, GaN has an excellent insulating property. Thus, an MIS structure having a low interface state and a high breakdown voltage can be formed.

Alternatively, an InP layer is epitaxially grown on the GaAs substrate, and an insulating layer is successively formed on the InP layer. Thus, boundaries of GaAS/InP and InP/insulating layer which have a low interface state can be obtained. As a result, an MIS structure having a low interface state can be obtained.

Alternatively, a native oxide film formed on the surface of GaAs is removed and dangling bonds which exist on the surface are terminated by sulfur, by immersing the GaAs substrate into an ammonium sulfide solution in which a chemical component constituting the insulating layer is dissolved. Thus, a GaAs surface having a remarkably low interface state can be prepared. The insulating layer is formed on the GaAs surface through electrodeposition, thereby forming an MIS structure including a boundary of GaAs/insulating layer having an extremely low interface state. Since lattice constants of MgS, MgSe and CaZnS are approximately equal to that of GaAs, the defect causing the interface state is prevented from occurring on the surface of GaAs if MgS, MgSe or CaZnS is used as the insulating layer. Moreover, having a large band gap, MgS, MgSe, or CaZns has an insulating property. Thus, an MIS structure having a low interface state and a high breakdown voltage can be formed.

When the surface of the GaAs substrate is treated with an $H_2S$ gas or an $H_2Se$ gas instead of the ammonium sulfide solution, and the insulating layer is formed by an MOCVD method or an MBE method, an excellent MIS structure is similarly obtained.

When the surface of the GaAs substrate is treated with the ammonium sulfide solution, and the GaAs substrate is exposed to an ammonia gas to be changed into an aluminum nitride layer after depositing an Al film on the substrate, an excellent MIS structure is similarly obtained.

Thus, the invention described herein makes possible the advantages of (1) providing a semiconductor device having an MIS type structure, which has both advantages of a silicon MOSFET and a GaAs MESFET and operates at high speed with low power consumption; and (2) providing a method for fabricating the same.

These end other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1A:
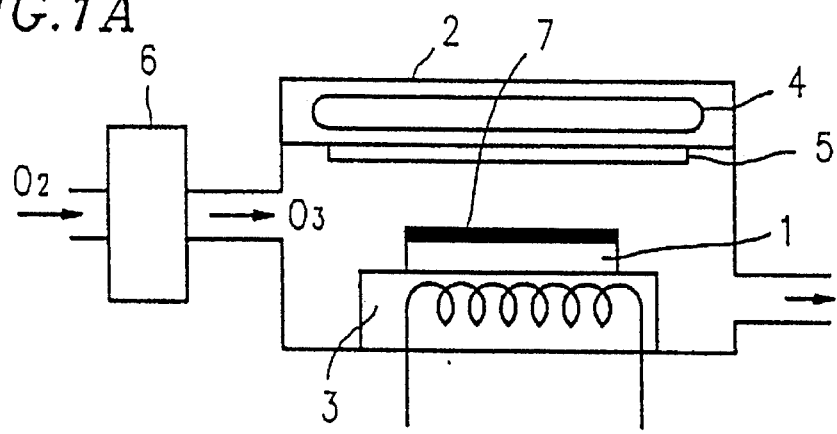
FIGS. 1A through 1D are cross-sectional views showing an MIS type semiconductor device according to Example 1 and a fabrication process for the same.
Figure 1B:
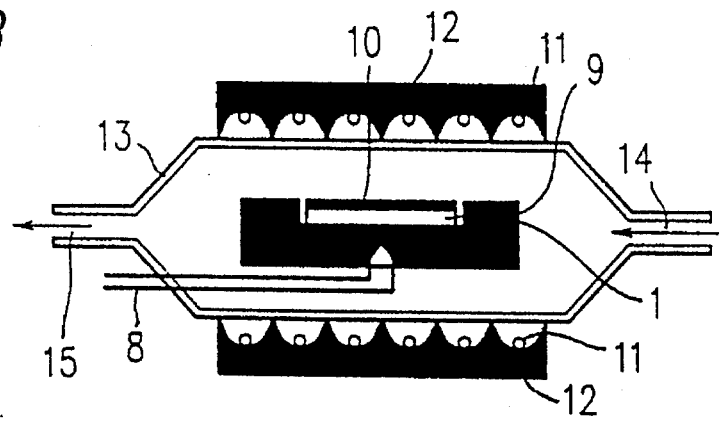
Figure 1C:
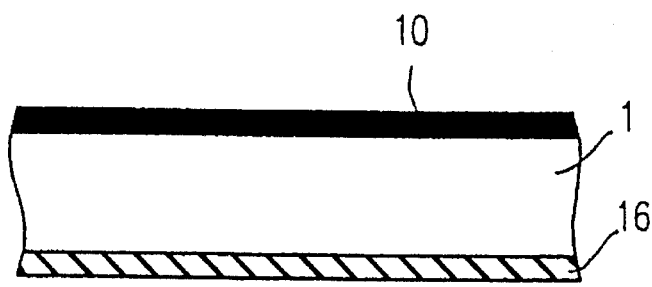
Figure 1D:
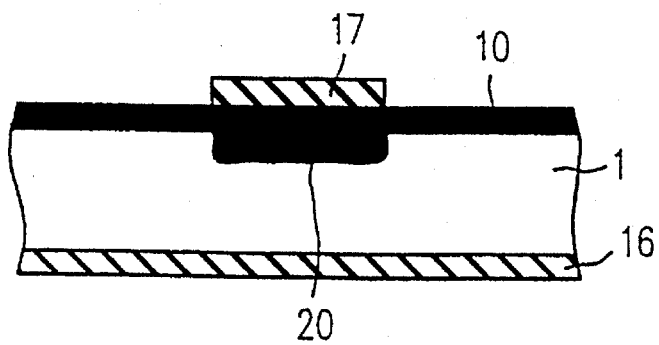

FIG. 1D is a cross-sectional view showing an MIS type diode according to the present invention. The MIS type diode of the present invention includes a GaAs substrate 1, a nitride layer 10 formed on the GaAs substrate 1 and a conductive electrode 17 formed on the nitride layer 10. An ohmic electrode 16 is formed on the face of the GaAS substrate 1 on which the nitride layer 10 is not formed. An inversion layer 20 is formed in the vicinity of the boundary with the nitride layer 10 in the GaAs substrate 1 in accordance with the voltage applied to the conductive electrode 17.

A method for fabricating the MIS type diode according to the example will be described with reference to FIGS. 1A through 1D.

As shown in FIG. 1A, the GaAs substrate 1 is placed on a heater 3 in a chamber 2 of a UV ozone cleaner apparatus. In this example and Examples 2 through 9 described below, the GaAs substrate 1 having n-type conductivity and a carrier density of about $1 \times 10^{17}$ cm$^{-3}$ is used. However, a substrate of a p-type may also be used, and the carrier density may be adjusted depending on its use. The UV ozone cleaner apparatus is equipped with an ozonizer 6 and a UV lamp 4, and ozone which is generated in the ozonizer 6 is introduced into the chamber 2. A UV ray which is generated by the UV lamp 4 is radiated on the GaAs substrate 1 through a quartz window 5.

The GaAs substrate 1 is heated at about 200° C. by using the heater 3, and then the UV ray is radiated on the surface of the GaAs substrate 1 in an ozone atmosphere for about 30 minutes. The heating by the heater 3 is preferably conducted at the temperature in the range of 100° C. to 300° C. The surface region of the GaAs substrate 1 is oxidized by the heating, thereby forming an oxide layer 7 on the surface of the GaAs substrate 1. The formed oxide layer 7 has a thickness of about 30 nm.

Next, as shown in FIGS. 1B, the GaAs substrate 1 is placed on a carbon susceptor 9 equipped with a thermocouple monitor 8 in an infrared lamp anneal apparatus so that the surface of the GaAs substrate 1 faces upward. The carbon susceptor 9 is housed within a quartz furnace 13 equipped with an inlet 14 and an outlet 15. An infrared lamp 11 is attached to the outside of the quartz furnace 13. The outside of the infrared lamp 11 is covered with a reflector 12.

An ammonia gas is introduced into a quartz furnace 13 through the inlet 14. The GaAs substrate 1 is heated by using the infrared lamp 11. The temperature of the GaAs substrate 1 is detected by the thermocouple monitor 8. The GaAs substrate is subjected to annealing in an ammonia atmosphere at a temperature of about 800° C. for 20 seconds, so that the oxide layer 7 is effectively nitrified to Change into a nitride layer 10. The annealing is preferably performed at a temperature in the range of about 700° C. to 850° C. for about 5 to 30 seconds.

As shown in FIG. 1C, after depositing an AuGe alloy on the back face of the GaAs substrate 1, the GaAs substrate 1 is alloyed in an argon atmosphere at a temperature of 450° C. for 30 seconds to form the ohmic electrode 16.

Thereafter, as shown in FIG. 1D, the conductive electrode 17 made of aluminum and having a predetermined pattern is formed on the nitride layer 10. Other metals such as titanium, gold and platinum may be used for the conductive electrode 17. Alternatively, a conductive electrode 17 having a multilayered structure which consists of the laminated layers of these metals may be formed. By the above process, the MIS type diode is completed.

According to the fabrication method of this example, the surface region of the GaAs substrate is oxidized by ozone, thereby forming an oxide. Since the GaAs substrate is kept at a relatively low temperature and a UV ray is used to promote the reaction, a GaAs oxide layer is formed on the surface of the GaAs substrate without damaging the GaAs substrate.

By the annealing in the ammonia gas atmosphere at a high temperature for a short period of time, oxygen in the GaAs oxide layer is replaced by nitrogen. As a result, a nitride layer which is mainly composed of gallium nitride (GAN) is formed.

GaN is a group III–V compound semiconductor and has an energy gap of about 3.4 eV. Therefore, GaN, to which an impurity is not added, has an excellent insulating property, and thus can be used as an insulating layer. A boundary between the nitride layer and the GaAs substrate is formed in the original GaAs substrate. Hence, an MIS type element having excellent properties can be obtained. Such an MIS type device is not affected by the damage on the surface of the used GaAs substrate or the plasma treatment. Moreover, the boundary between an insulating layer and the semiconductor of the MIS type device has a low interface state density.

EXAMPLE 2

Figure 2A:
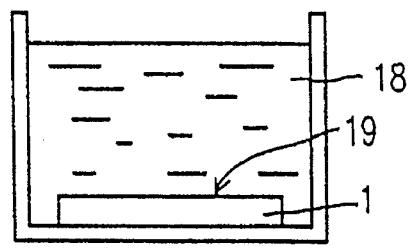
FIGS. 2A through 2E are cross-sectional views showing an MIS type semiconductor device according to Example 2 and a fabrication process for the same.
Figure 2B:
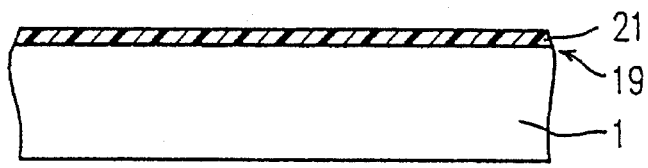
Figure 2C:
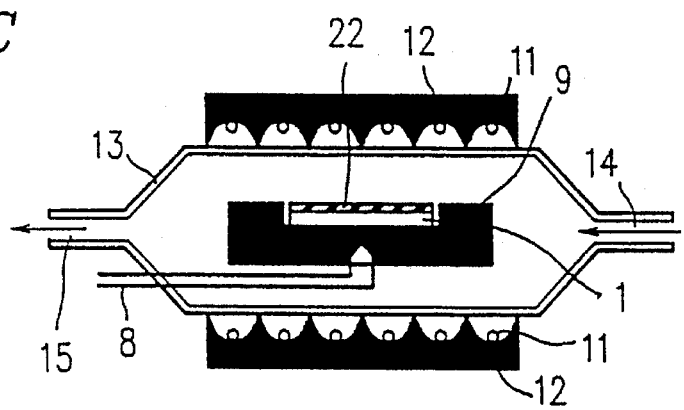
Figure 2D:
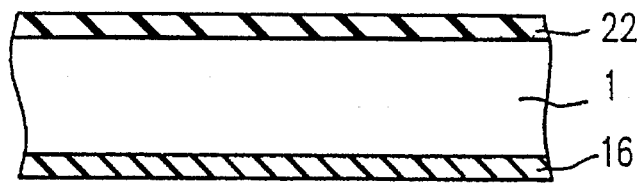
Figure 2E:
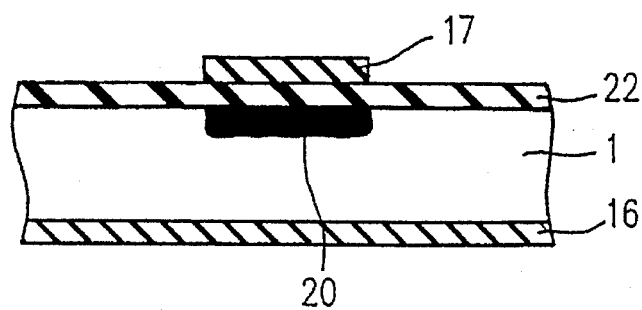

FIG. 2E is a cross-sectional view showing an MIS type diode according to the present invention. The MIS type diode includes a GaAs substrate 1, an aluminum nitride layer 22 formed on the GaAs substrate 1, and a conductive electrode 17 formed on the aluminum nitride layer 22. An ohmic electrode 16 is formed on the face of GaAs substrate 1 on which the nitride layer 22 is not formed. An inversion layer 20 is formed in the vicinity of the boundary with the nitride layer 22 in the GaAs substrate 1 in accordance with the voltage applied to the conductive electrode 17.

A method for fabricating an MIS diode according to Example 2 will be described with reference to FIGS. 2A to 2E.

As shown in FIG. 2A, the GaAs substrate 1 is immersed into an ammonium sulfide solution 18 so as to treat the surface of the substrate. With this surface treatment, a native oxide film formed on the surface of the GaAs substrate 1 is dissolved into the ammonium sulfide solution 18. Simultaneously, a number of dangling bonds, which exist on the surface of the GaAs substrate, are terminated by sulfur 19 of a monoatomic layer. As the ammonium sulfide solution, a colorless $(NH_4)_2S$ solution may be used. Alternatively, a yellow $(NH_4)_2S_x$ solution containing sulfur at a high rate may also be used.

Next, as shown in FIG. 2B, the aluminum layer 21 (thickness: 10 nm) is formed by deposition on the GaAs substrate 1 on which sulfur 19 of the monoatomic layer is formed. The aluminum layer 21 preferably has a thickness in the range of 5 to 15 nm. As shown in FIG. 2C, the GaAs substrate 1 is set within the infrared lamp annealing apparatus. The infrared lamp annealing apparatus has the same configuration as that described in Example 1. Components having the same functions as those of Example 1 are indicated by the same reference numerals.

An ammonia gas is introduced into a quartz furnace 13 through the inlet 14. The GaAs substrate 1 is subjected to annealing in an ammonia gas atmosphere at a temperature of about 500° C. for 60 seconds. The annealing is preferably performed at a temperature in the range of about 450° C. to 550° C. for about 30 to 100 seconds. By the annealing, the aluminum layer 21 formed on the surface of the GaAs substrate 1 is nitrified to be changed into an insulating aluminum nitride layer 22. Therefore, a boundary of GaAs/ AlN insulating layer maintaining excellent boundary properties can be obtained.

As shown in FIG. 2D, after depositing an AuGe alloy on the opposite face of the GaAs substrate 1, the GaAs substrate 1 is alloyed in an argon atmosphere at a temperature of 450° C. for 30 seconds to form the ohmic electrode 16.

Thereafter, as shown in FIG. 2E, the conductive electrode 17 made of aluminum and having a predetermined pattern is formed on the aluminum nitride layer 22. Other metals such as titanium, gold and platinum may be used for the conductive electrode 17. Alternatively, a conductive electrode 17 having a multilayered structure which consists of the laminated layers of these metals may be formed. By the above process, the MIS type diode is completed.

According to the fabrication method of Example 2, the GaAs substrate is immersed into the ammonium sulfide solution, thereby passivating the surface of the GaAs substrate with sulfur of a monoatomic layer. Subsequently, the aluminum film is formed on the surface of the GaAs substrate. As a result, a boundary of GaAs/Al having a remarkably low interface state density is formed. Therefore, by nitrifying the aluminum film, a boundary of GaAs/AlN insulating layer maintaining excellent boundary properties can be obtained. As a result, an MIS device having excellent properties can be obtained.

EXAMPLE 3

Figure 3A:
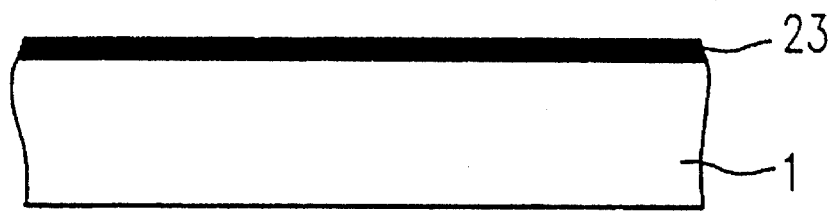
FIGS. 3A through 3D are cross-sectional views showing an MIS type semiconductor device according to Example 3 and a fabrication process for the same.
Figure 3B:
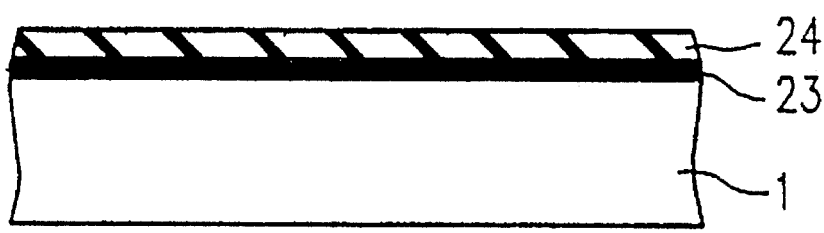
Figure 3C:
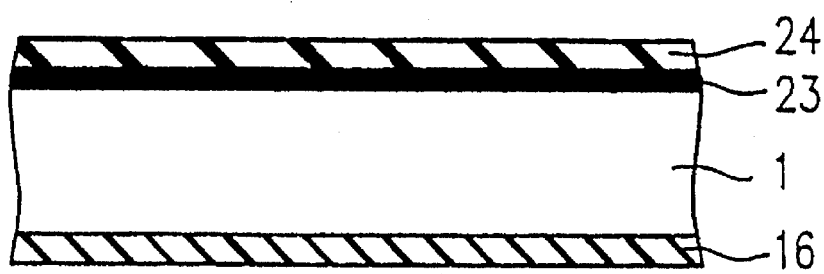
Figure 3D:
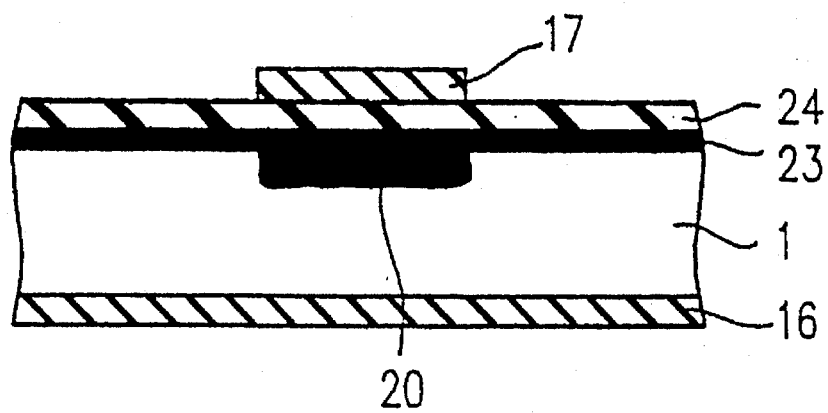

FIG. 3D is a cross-sectional view showing an MIS type diode according to the present invention. The MIS type diode includes a GaAs substrate 1, an InP thin film 23 formed on the GaAs substrate 1, a silicon nitride layer 24 formed on the InP thin film 23, and a conductive electrode 17 formed on the silicon nitride layer 24. An ohmic electrode 16 is formed on the face of GaAs substrate 1 opposite to which the InP thin film 23 is formed. An inversion layer 20 is formed in the vicinity of the boundary with the InP thin film 23 in the GaAs substrate 1 in accordance with the voltage applied to the conductive electrode 17.

A method for fabricating an MIS diode according to Example 3 will be described with reference to FIGS. 3A to 3D.

As shown in FIG. 3A, the InP thin film 23 is epitaxially grown on the GaAs substrate 1 by an MOCVD method. Instead of the MOCVD method, an MBE method may also be used. The InP thin film 23 preferably has a thickness equal to or less than a critical thickness (about 3 nm), more preferably has a thickness of 2 nm or less. The critical thickness is a maximum thickness at which dislocation due to lattice mismatch does not occur. The lattice mismatch of about 3.8% occurs between GaAs and InP. However, if the thickness of the InP thin film 23 is equal to or less than the critical thickness, the interface state and the dislocation are substantially not generated at the boundary of GaAs/InP.

Next, as shown in FIG. 3B, the silicon nitride layer 24 (thickness: 30 nm) is formed on the InP thin film 23 by using a light CVD method.

As shown in FIG. 3C, after depositing an AuGe alloy on the opposite face of the GaAs subsTrate 1, the GaAs substrate 1 is alloyed in an argon atmosphere at a temperature of 450° C. for 30 seconds to form the ohmic electrode 16.

Thereafter, as shown in FIG. 3D, the conductive electrode 17 made of aluminum and having a predetermined pattern is formed on the silicon nitride layer 24. Other metals such as titanium, gold and platinum may be used for the conductive electrode 17. Alternatively, a conductive electrode having a multilayered structure which consists of the laminated layers of these metals may be formed. By the above process, the MIS type diode is completed.

According to the fabrication method of the example, the InP layer having a thickness equal to or less than the critical thickness is epitaxially grown. Therefore, a boundary of GaAs/InP having excellent properties such as the low interface state and the rare occurrence of dislocation and the like can be obtained. The excellent properties of a low interface state are obtained in the boundary of the InP/insulating layer as compared with the boundary of GaAs/insulating layer. Thus, the device is configured to have the structure of GaAs/InP/insulating layer, whereby an excellent MIS type device is obtained.

EXAMPLE 4

Figure 4A:
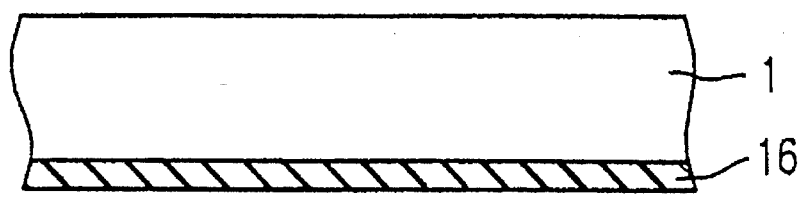
FIGS. 4A through 4C are cross-sectional views showing an MIS type semiconductor device according to Example 4 and a fabrication process for the same.
Figure 4B:
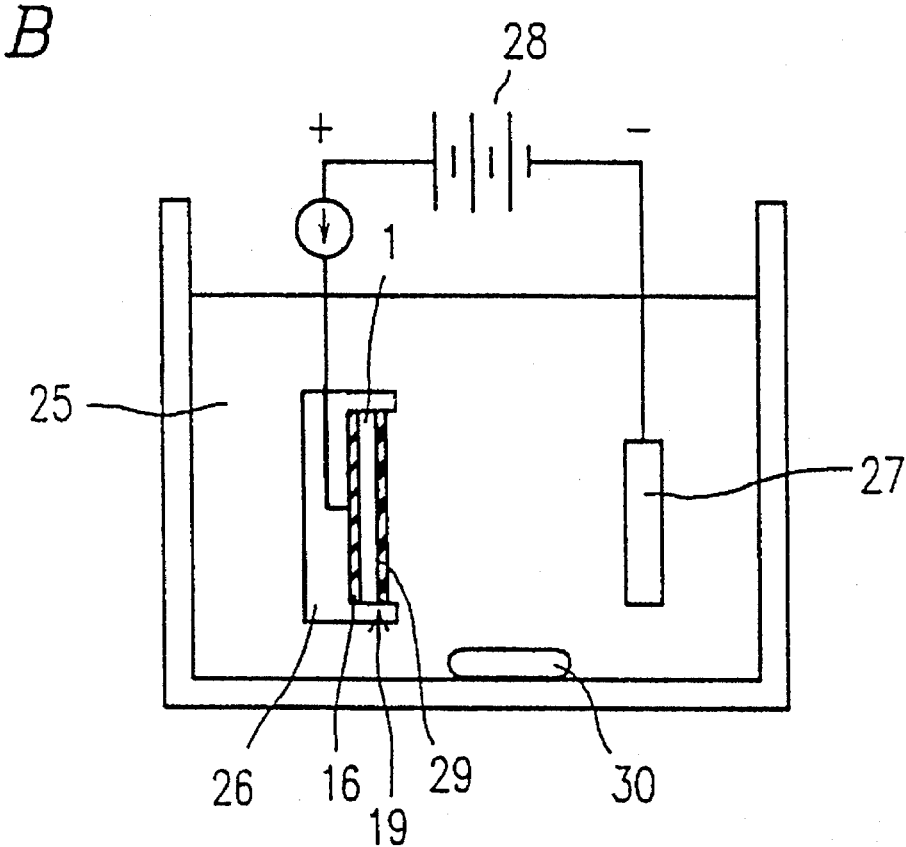
Figure 4C:
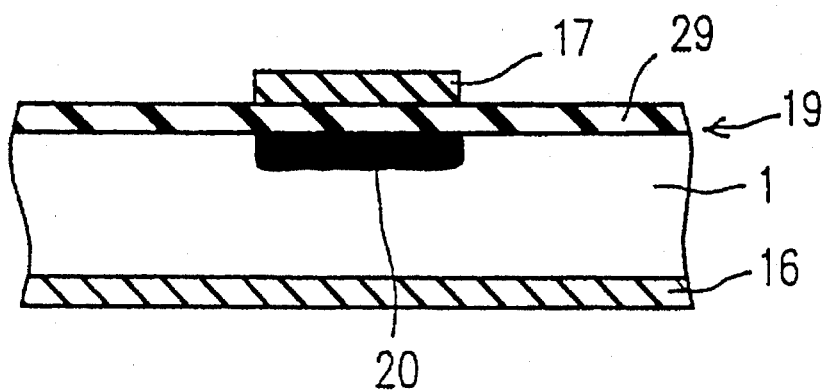

FIG. 4C is a cross-sectional view showing an MIS type diode according to the present invention. The MIS type diode of the present invention includes a GaAs substrate 1, an organic insulating layer 29 formed on the GaAs substrate 1, and a conductive electrode 17 formed on the organic insulating layer 29. An ohmic electrode 16 is formed on the face of GaAs substrate 1 opposite to which the organic insulating layer 29 is formed. An inversion layer 20 is formed in the vicinity of the boundary with the organic insulating layer 29 in the GaAs substrate 1 in accordance with the voltage applied to the conductive electrode 17.

A method for fabricating an MIS diode according to Example 4 will be described with reference to FIGS. 4A to 4C.

As shown in FIG. 4A, after depositing an AuGe alloy on the back face of the GaAs substrate 1, the GaAs substrate 1 is alloyed in an argon atmosphere at a temperature of 450° C. for 30 seconds to form the ohmic electrode 16.

Next, as shown in FIG. 4B, an organic substance including sulfur atoms, for example, an ammonium sulfide solution 25 in which n-octadecylmercaptan ($CH_3(CH_2)_{17}SH$) is dissolved is prepared. N-octadecylmercaptan is a component constituting an insulating layer which is to be formed on the GaAs substrate 1. The GaAs substrate 1 is attached to a susceptor 26 made of Teflon, and then is immersed into the ammonium sulfide solution 25. As the ammonium sulfide solution, a colorless $(NH_4)_2S$ solution may be used. Alternatively, a yellow $(NH_4)_2S_x$ solution containing sulfur at a high rate may also be used. A counter electrode 27 made of platinum is immersed into the ammonium sulfide solution 25. A constant current source 28 is connected to the ohmic electrode 16 of the GaAs substrate 1 and the counter electrode 27 so that the GaAs substrate 1 functions as an anode and the counter electrode 27 functions as a cathode. With such a configuration, the organic insulating layer 29 is electrodeposited on the surface of the GaAs substrate 1.

When the GaAs substrate 1 is immersed into the ammonium sulfide solution 25, a native oxide film formed on the surface of the GaAs substrate 1 is dissolved into the ammonium sulfide solution 25. Simultaneously, a number of dangling bonds, which exist on the surface of the GaAs substrate, are terminated in a monoatomic layer 19 of sulfide. Subsequently, n-octadecylmercaptan, which is dissociated as a weak acid in the ammonium sulfide solution 25, is oxidized on the surface of the GaAs substrate 1 and electrodeposited as an organic compound containing sulfur, thereby forming an organic insulating layer 29. Since the back face of the GaAs substrate 1 is in close contact with the susceptor 26 made of Teflon, the insulating layer is not electrodeposited on the back face thereof. The thickness of the organic insulating layer 29 can be controlled by the density of the current flowing across the GaAs substrate 1 and time. The thickness of the organic insulating layer 29 is preferably in the range of 20 nm to 50 nm. AS a component constituting the organic insulating layer, 1-Hexadecanethiol ($CH_3(CH_2)_{15}SH$) and the like can be used. Moreover, it is preferable that the ammonium sulfide solution 25 is stirred by using a stirrer 30 and the like so as to improve uniformness of the organic insulating layer to be formed.

Thereafter, as shown in FIG. 4C, the conductive electrode 17 made of aluminum and having a predetermined pattern is formed on the organic insulating layer 29. Other metals such as titanium, gold and platinum may be used for the conductive electrode 17. Alternatively, a conductive electrode having a multilayered structure which consists of the laminated layers of these metals may be formed. By the above process, the MIS type diode is completed.

According to the fabrication method of the example, passivation is performed on the surface of the GaAs substrate by a monoatomic layer of sulfur by immersing the GaAs substrate into the ammonium sulfide solution. Subsequently, by electrodepositing the organic insulating layer on the surface of the GaAs substrate, a boundary of GaAs/insulating layer having a remarkably low interface state density can be formed. Thus, an excellent MIS type device having a remarkably low interface state density can be obtained.

EXAMPLE 5

Figure 5A:
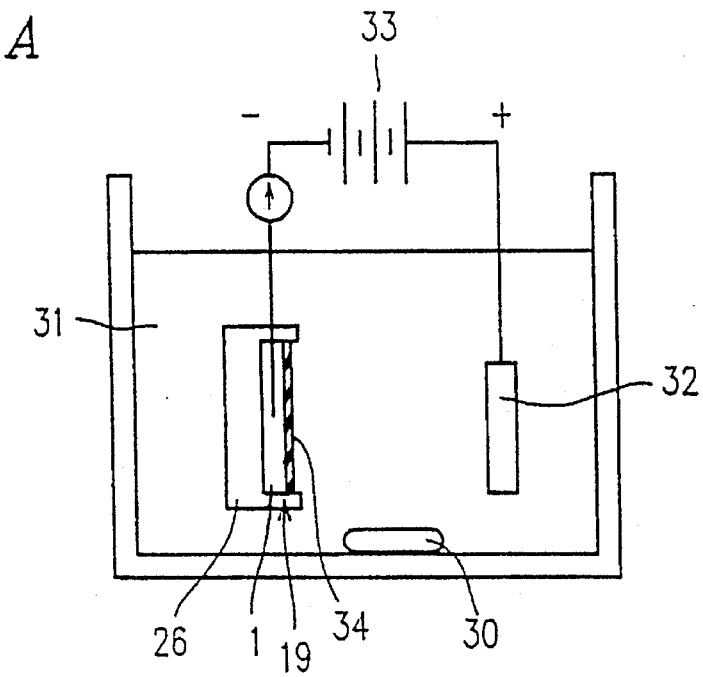
FIGS. 5A through 5D are cross-sectional views showing an MIS type semiconductor device according to Example 5 and a fabrication process for the same.
Figure 5B:
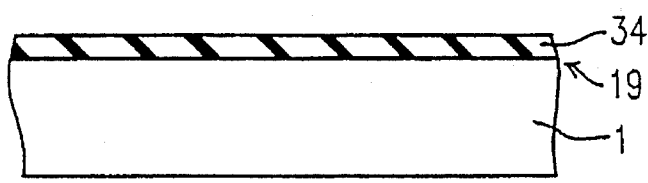
Figure 5C:
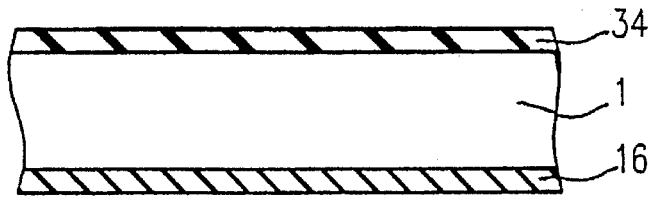
Figure 5D:
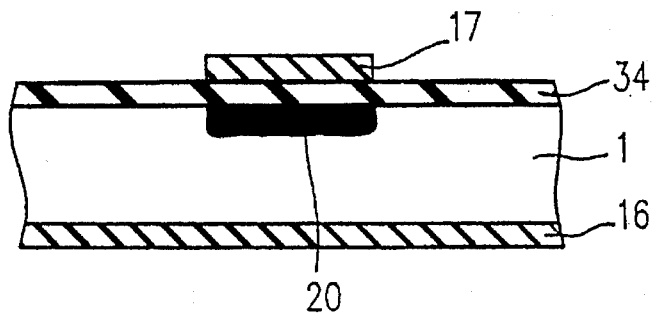

FIG. 5D is a cross-sectional view showing an MIS type diode according to the present invention. The MIS type diode of the present invention includes a GaAs substrate 1, an MgS layer 34 formed on the GaAs substrate 1, and a conductive electrode 17 formed on the MgS layer 34. An ohmic electrode 16 is formed on the face of GaAs substrate 1 opposite to which the MgS layer 34 is formed. An inversion layer 20 is formed in the vicinity of the boundary with the MgS layer 34 in the GaAs substrate 1 in accordance with the voltage applied to the conductive electrode 17.

A method for fabricating an MIS diode according to Example 5 will be described with reference to FIGS. 5A to 5C.

As shown in FIG. 5A, an ammonium sulfide solution 31, in which a compound containing magnesium, for example, magnesium oxide (MgO), is dissolved, is prepared. Magnesium is a component constituting an insulating layer which is to be formed on the GaAs substrate 1. The composition of MgS can be controlled by controlling the concentration of magnesium in the ammonium sulfide solution. As the ammonium sulfide solution, a colorless $(NH_4)_2S$ solution may be used. Alternatively, a yellow $(NH_4)_2S_x$ solution containing sulfur at a high rate may also be used.

The GaAs substrate 1 is attached to the susceptor 26 made of Teflon, and is immersed into the ammonium sulfide solution 31. A counter electrode 32 made of platinum is immersed into the ammonium sulfide solution 31. A constant current source 33 is connected to the GaAs substrate 1 and the counter electrode 31 so that the GaAs substrate 1 functions as a cathode and the counter electrode 32 functions as an anode. With such a configuration, the MgS film 34 is electrodeposited on the surface of the GaAs substrate 1.

When the GaAs substrate 1 is immersed into the ammonium sulfide solution 31, a native oxide film formed on the surface of the GaAs substrate 1 is dissolved into the ammonium sulfide solution 31. Simultaneously, a number of dangling bonds, which exist in the surface of the GaAs substrate, are terminated by a monoatomic layer 19 of sulfur. Subsequently, magnesium ions ($Mg^{2+}$), which are dissolved in the ammonium sulfide solution 31, are reduced on the surface of the GaAs substrate 1, and electrodeposited on the surface of the GaAs substrate 1 with sulfur (S) dissolved in the ammonium sulfide solution 31 as MgS. As a result, as shown in FIG. 5B, an MgS layer 34 is formed on the GaAs substrate 1. Since the back face of the GaAs substrate 1 is in close contact with a susceptor 26 made of Teflon, the MgS film is not electrodeposited on the back face thereof. The thickness of the MgS layer 34 can be controlled by the density of the current flowing across the GaAs substrate 1 and time. The thickness of the MgS layer 34 is preferably in the range of 20 nm to 50 nm. Moreover, it is preferable that the ammonium sulfide solution 31 is stirred by using a stirrer 30 and the liked so as to improve uniformness of the insulating layer to be formed.

As shown in FIG. 5C, after deposition an AuGe alloy on the opposite face of the GaAs substrate 1, the GaAs substrate 1 is alloyed in an argon atmosphere at a temperature of 450° C. for 30 seconds to form the ohmic electrode 16.

Thereafter, as shown in FIG. 5D, the conductive electrode 17 made of aluminum and having a predetermined pattern is formed on the MgS layer 34. Other metals such as titanium, Gold and platinum may be used for the conductive electrode 17. Alternatively, a conductive electrode having a multilayered structure which consists of the laminated layers of these metals may be formed. By the above process, the MIS type diode is completed.

Figure 6:
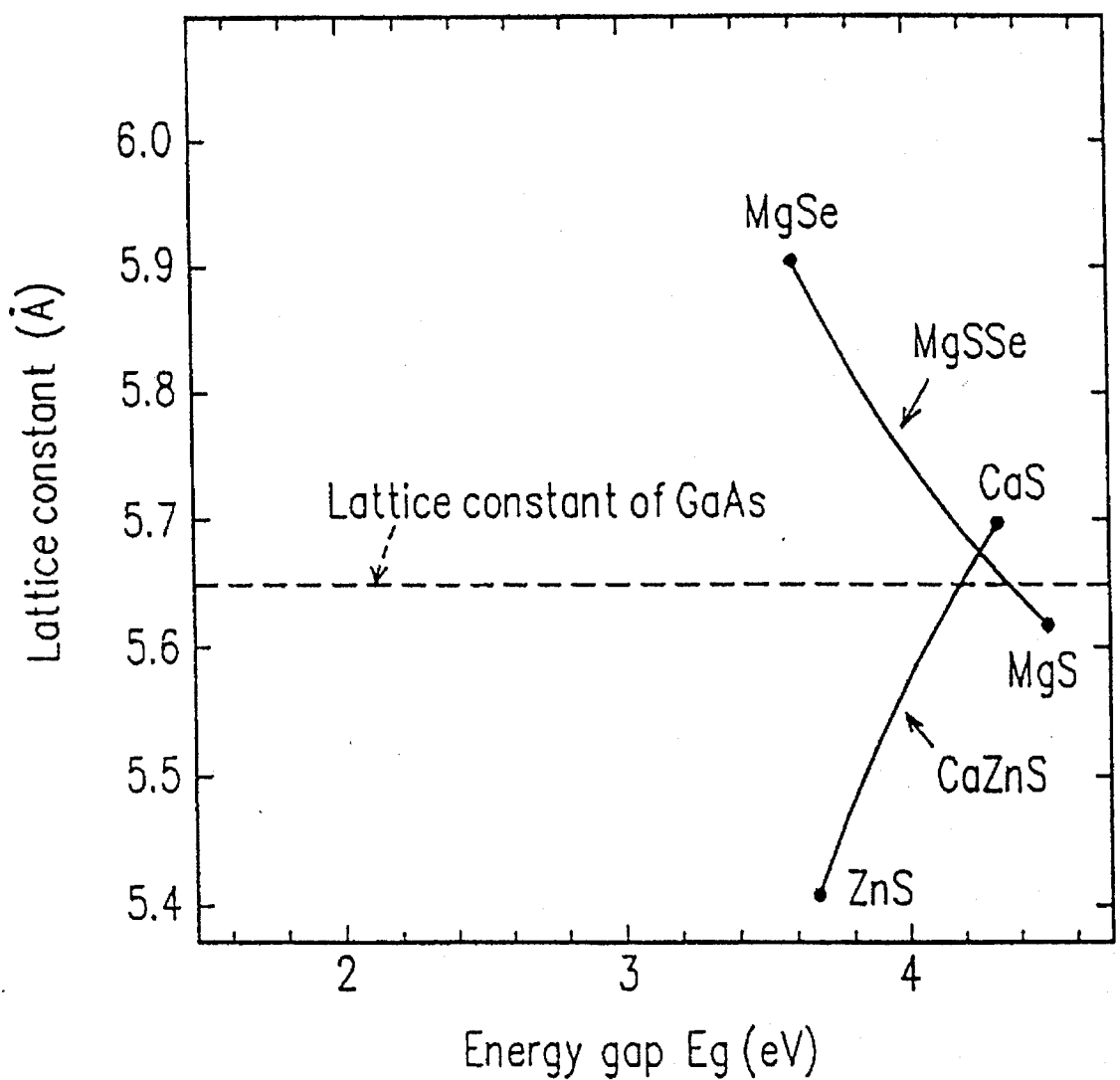
FIG. 6 is a graph illustrating lattice constants and energy gaps of materials constituting an insulating layer used in a semiconductor device of the present invention.

According to the fabrication method of the example, passivation is performed on the surface of the GaAs substrate by a monoatomic layer of sulfur by immersing the GaAs substrate into the ammonium sulfide solution. Subsequently, by electrodepositing the MgS film on the surface of the GaAs substrate, the MgS film can be formed while the surface of the GaAs substrate is kept out of contact with oxygen in the atmosphere. Moreover, as shown in FIG. 6, since MgS has a lattice constant which is extremely close to that of GaAs, the interface state density and the dislocation defect density are remarkably reduced. Moreover, MgS is a group II–VI compound semiconductor, which has an energy gap of about 4.5 eV. MgS, to which no impurity is added, has a high insulating property, and therefore can be used as an insulating layer. Thus, an excellent MIS type device having a remarkably low interface state density and a high breakdown voltage can be obtained.

EXAMPLE 6

Figure 7A:
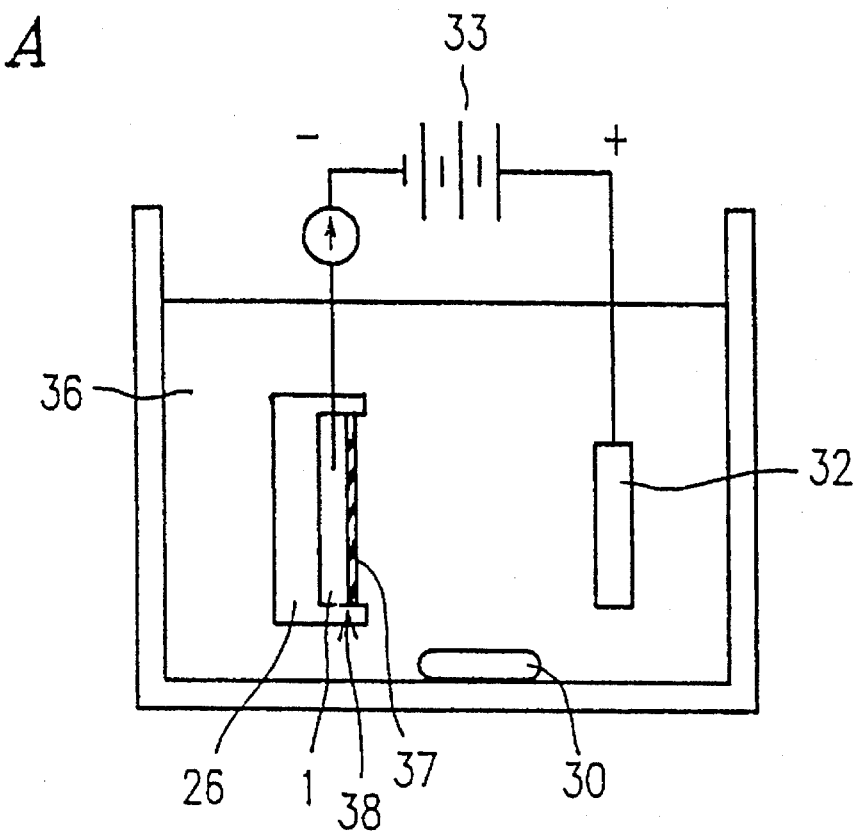
FIGS. 7A through 7C are views showing an MIS type semiconductor device according to Example 6 and a fabrication process for the same.
Figure 7B:
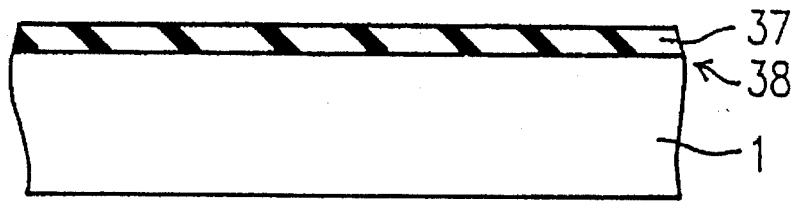
Figure 7C:
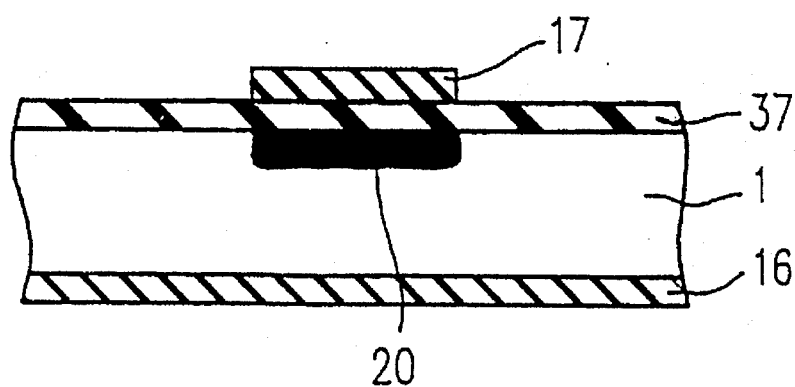

FIG. 7C is a cross-sectional view showing an MIS type diode according to the present invention. The MIS type diode of the present invention includes a GaAs substrate 1, an MgSSe layer 37 formed on the GaAs substrate 1, and a conductive electrode 17 formed on the MgSSe layer 37. An ohmic electrode 16 is formed on the face of GaAs substrate 1 opposite to which the MgSSe layer 37 is formed. An inversion layer 20 is formed in the vicinity of the boundary with the MgSSe layer 37 in the GaAs substrate 1 in accordance with the voltage applied to the conductive electrode 17.

A method for fabricating an MIS diode according to Example 6 will be described with reference to FIGS. 7A to 7C.

As shown in FIG. 7A, an ammonium sulfide solution 36, in which a compound containing magnesium and selenium, for example, magnesium oxide (MgO) and selenium oxide ($SeO_2$), is dissolved, is prepared. Alternatively, the ammonium sulfide solution 36, in which powdered selenium is dissolved, may be used. Magnesium and selenium are components constituting an insulating layer (MgSSe film) which is to be formed on the GaAs substrate 1. The composition of MgSSe can be controlled by controlling the concentration of magnesium and selenium in the ammonium sulfide solution. As the ammonium sulfide solution, a colorless $(NH_4)_2S$ solution may be used. Alternatively, a yellow $(NH_4)_2S_x$ solution containing sulfur at a high rate may also be used.

The GaAs substrate 1 is attached to a susceptor 26 made of Teflon, and is immersed into the ammonium sulfide solution 36. A counter electrode 32 made of platinum is immersed into the ammonium sulfide solution 36. A constant current source 33 is connected to the GaAs substrate 1 and the counter electrode 31 so that the GaAs substrate 1 functions as a cathode and the counter electrode 32 functions as an anode. With such a configuration, the MgSSe film 37 is electrodeposited on the surface of the GaAs substrate 1.

When the GaAs substrate 1 is immersed into the ammonium sulfide solution 36, a native oxide film formed on the surface of the GaAs substrate 1 is dissolved into the ammonium sulfide solution 36. Simultaneously, a number of dangling bonds, which exist in the surface of the GaAs substrate, are terminated by a monoatomic layer of sulfur or selenium 38. Subsequently, magnesium ions ($Mg^{2+}$), which are dissolved in the ammonium sulfide solution 36, are reduced on the surface of the GaAs substrate 1 and electrodeposited on the surface of the GaAs substrate 1 with sulfur (S) and selenium (Se) dissolved in the ammonium sulfide solution 36 as MgSSe. As a result, as shown in FIG. 7B, an MgSSe film 37 is formed on the GaAs substrate 1. Since the back face of the GaAs substrate 1 is in close contact with the susceptor 26 made of Teflon, the MgSSe layer is not electrodeposited on the back face thereof. The thickness of the MgSSe layer 37 can be controlled by the density of the current flowing across the GaAs substrate 1 and time. The thickness of the MgSSe layer 37 is preferably in the range of 20 nm to 50 nm. Moreover, it is preferable that the ammonium sulfide solution 36 is stirred by using a stirrer 30 and the like so as to improve uniformness of the insulating layer to be formed.

As shown in FIG. 7C, after depositing an AuGe alloy on the back face of the GaAs substrate 1, the GaAs substrate 1 is alloyed in an argon atmosphere at a temperature of 450° C. for 30 seconds to form the ohmic electrode 16. Thereafter, the conductive electrode 17 made of aluminum and having a predetermined pattern is formed on the MgSSe layer 37. Other metals such as titanium, gold and platinum may be used for the conductive electrode 17. Alternatively, a conductive electrode having a multilayered structure which consists of the laminated layers of these metals may be formed. By the above process, the MIS type diode is completed.

According to the fabrication method of the example, passivation is performed on the surface of the GaAs substrate by a monoatomic layer of sulfur or selenium by immersing the GaAs substrate into the ammonium sulfide solution. Subsequently, by electrodepositing the MgSSe layer on the surface of the GaAs substrate, the MgSSe layer can be formed while the surface of the GaAs substrate is kept out of contact with oxygen in the atmosphere. Moreover, as shown in FIG. 6, since MgSSe can be lattice-matched with GaAs, the interface state density and the dislocation defect density are remarkably reduced in the vicinity of the surface of GaAs in contact with the MgSSe film. Moreover, MgSSe is a group II–VI compound semiconductor, which has an energy gap of about 4.4 eV. MgSSe, to which no impurity is added, has a high insulating property, and therefore can be used as an insulating layer. Thus, an excellent MIS type device having a remarkably low interface state density and a high breakdown voltage can be obtained.

EXAMPLE 7

Figure 8A:
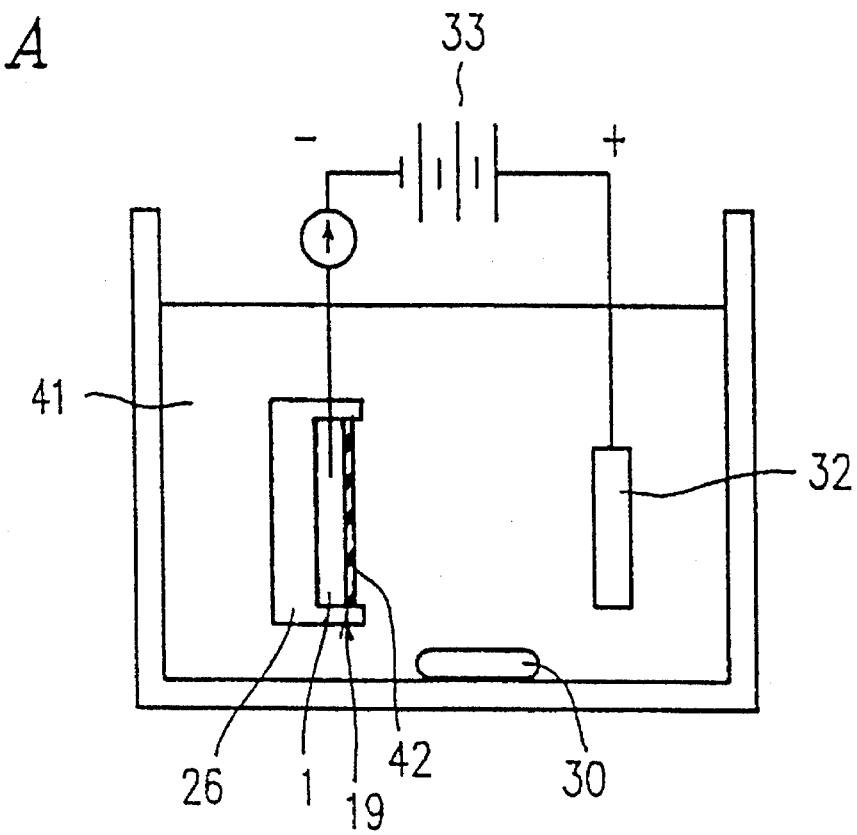
FIGS. 8A through 8C are views showing an MIS type semiconductor device according to Example 7 and a fabrication process for the same.
Figure 8B:
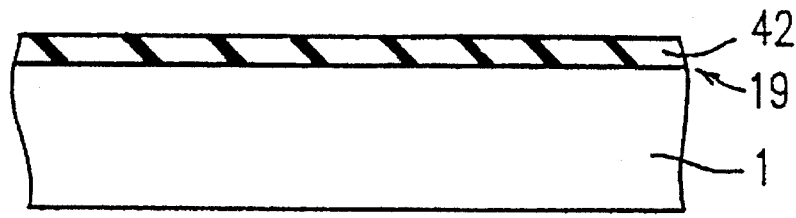
Figure 8C:
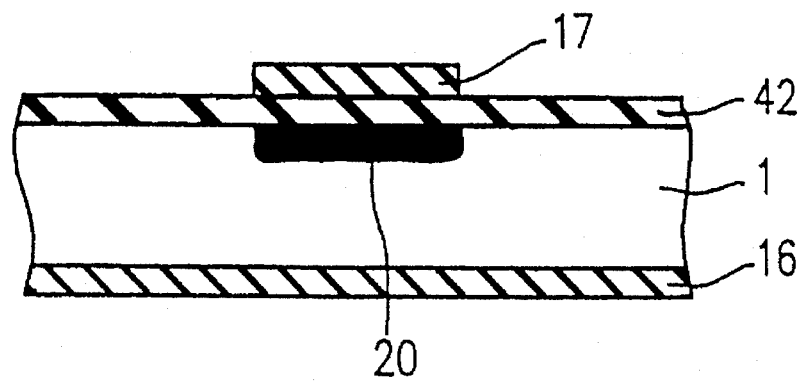

FIG. 8C is a cross-sectional view showing an MIS type diode according to the present invention. The MIS type diode of the present invention includes a GaAs substrate 1, a CaZnS layer 42 formed on the GaAs substrate 1, and a conductive electrode 17 formed on the CaZnS layer 42. An ohmic electrode 16 is formed on the face of the GaAs substrate 1 opposite to which the CaZnS layer 42 is formed. An inversion layer 20 is formed in the vicinity of the boundary with the CaZnS layer 42 on the GaAs substrate 1 in accordance with the voltage applied to the conductive electrode 17.

A method for fabricating an MIS type diode according to Example 7 will be described with reference to FIGS. 8A to 8C.

As shown in FIG. 8A, an ammonium sulfide solution 41, in which a compound containing calcium and zinc, for example, calcium oxide (CaO) and zinc oxide (ZnO), is dissolved, is prepared. Calcium and zinc are components constituting an insulating layer which is to be formed on the GaAs substrate 1. The composition of CaZnS can be controlled by controlling the concentration of calcium and zinc in the ammonium sulfide solution. As the ammonium sulfide solution, a colorless $(NH_4)_2S$ solution may also be used. Alternatively, a yellow $(NH_4)_2S_x$ solution containing sulfur at a high rate may also be used.

The GaAs substrate 1 is attached to a susceptor 26 made of Teflon, and then immersed into the ammonium sulfide solution 41. A counter electrode 32 made of platinum is immersed into the ammonium sulfide solution 41. A constant current source 33 is connected to the GaAs substrate 1 and the counter electrode 31 so that the GaAs substrate 1 functions as a cathode and the counter electrode 32 functions as an anode. With such a configuration, the CaZnS layer 42 is electrodeposited on the surface of the GaAs substrate 1.

When the GaAs substrate 1 is immersed into the ammonium sulfide solution 41, a native oxide film formed on the surface of the GaAs substrate 1 is dissolved into the ammonium sulfide solution 41. Simultaneously, a number of dangling bonds, which are present on the surface of the GaAs substrate, are terminated by sulfur 19 of a monoatomic layer. Subsequently, calcium ions ($Ca^{2+}$) and zinc ions ($Zn^{2+}$), which are dissolved in the ammonium sulfide solution 41, are reduced on the surface of the GaAs substrate 1. The reduced calcium and zinc are electrodeposited on the surface of the GaAs substrate 1 with sulfur (S) dissolved in the ammonium sulfide solution 41 as CaZnS. As a result, as shown in FIG. 8B, a CaZnS layer 42 is formed on the GaAs substrate 1. Since the back face of the GaAs substrate 1 is in close contact with the susceptor 26 made of Teflon, the CaZnS film is not electrodeposited on the back face thereof. The thickness of the CaZnS layer 42 can be controlled by the density of the current flowing across the GaAs substrate 1 and time. The thickness of the CaZnS layer 42 is preferably in the range of 20 nm to 50 nm. Moreover, it is preferable that the ammonium sulfide solution 41 is stirred by using a stirrer 30 and the like so as to improve uniformness of the insulating layer to be formed.

As shown In FIG. 8C, after depositing AuGe alloy on the back face of the GaAs substrate 1, the GaAs substrate 1 is alloyed in an argon atmosphere at a temperature of 450° C. for 30 seconds to form the ohmic electrode 16. Thereafter, the conductive electrode 17 made of aluminum and having a predetermined pattern is formed on the CaZnS film 42. Other metals such as titanium, gold and platinum may be used for the conductive electrode 17. Alternatively, a conductive electrode having a multilayered structure which consists of the laminated layers of these metals may be formed. By the above process, the MIS type diode is completed.

According to the fabrication method of the example, passivation is performed on the surface of the GaAs substrate by a monoatomic layer of sulfur by immersing the GaAs substrate into the ammonium sulfide solution. Subsequently, by electrodepositing the CaZnS film on the surface of the GaAs substrate, the CaZnS film can be formed while the surface of the GaAs substrate is kept out of contact with oxygen in the atmosphere. Moreover, as shown in FIG. 6, since CaZnS can be lattice-matched with GaAs, the interface state density and the dislocation defect density are remarkably reduced in the vicinity of the surface of GaAs in contact with the CaZnS film. Moreover, CaZnS is a group II–VI compound semiconductor, which has an energy gap of about 4.2 eV. CaZnS, to which no impurity is added, has a high insulating property, and therefore can be used as an insulating layer. Thus, an excellent MIS type device having a remarkably low interface state density and a high breakdown voltage can be obtained.

EXAMPLE 8

Figure 9A:
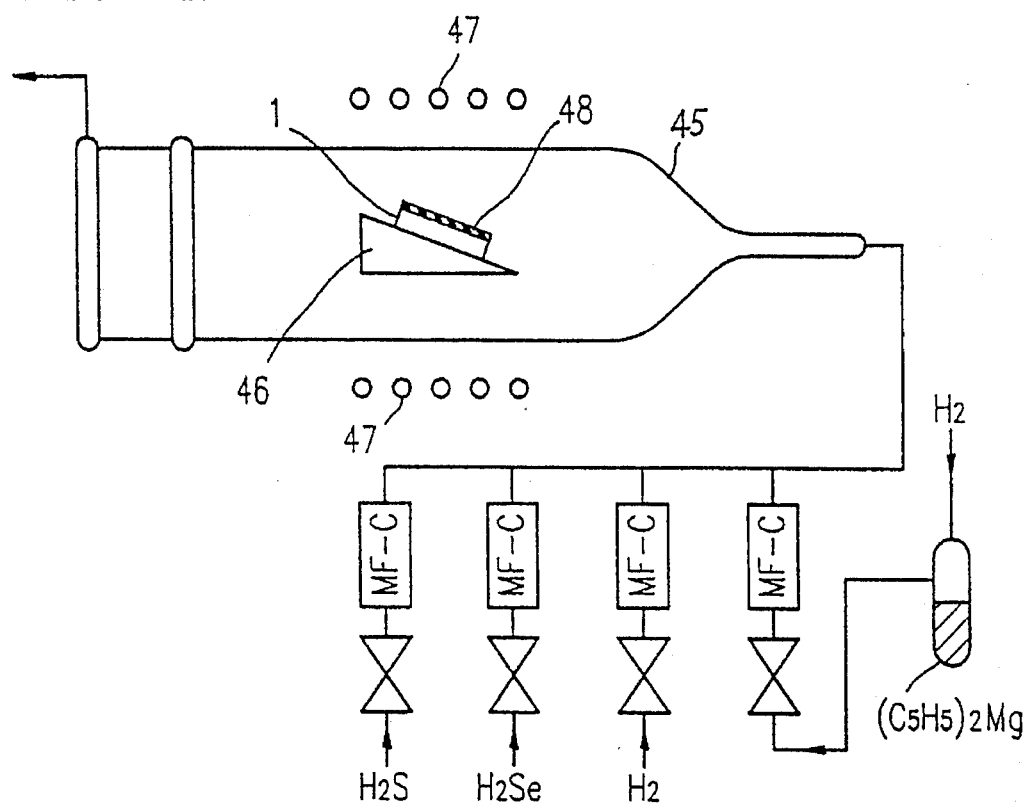
FIGS. 9A through 9D are views showing an MIS type semiconductor device according to Example 8 and a fabrication process for the same.
Figure 9B:
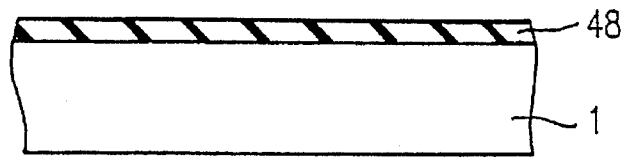
Figure 9C:
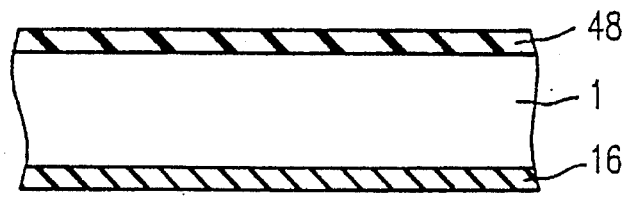
Figure 9D:
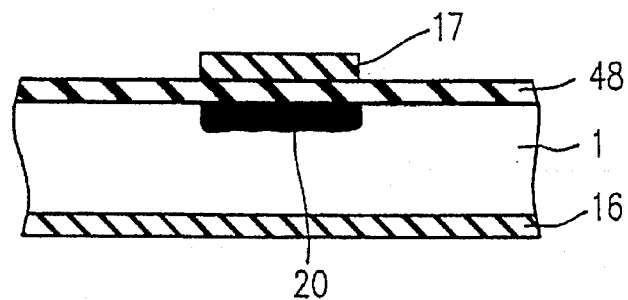

FIG. 9D is a cross-sectional view showing an MIS type diode according to the present invention. The MIS type diode of the present invention includes a GaAs substrate 1, an MgSSe layer 48 formed on the GaAs substrate 1, and a conductive electrode 17 formed on the MgSSe layer 48. An ohmic electrode 16 is formed on the face of GaAs substrate 1 opposite to which the MgSSe layer 48 is formed. An inversion layer 20 is formed in the vicinity of the boundary with the MgSSe layer 48 in the GaAs substrate 1 in accordance with the voltage applied to the conductive electrode 17.

A method for fabricating an MIS diode according to Example 8 will be described with reference to FIGS. 9A to 9D.

As shown in FIG. 9A, the GaAs substrate 1 is held in a susceptor 46 made of carbon which is placed in a reactor 45 of an MOCVD device. The susceptor 46 made of carbon is subjected to radio frequency induction heating by a high frequency coil 47 provided for the outside of the reactor 45, thereby heating the susceptor 46 to a predetermined temperature.

First, an $H_2S$ gas or an $H_2Se$ gas is introduced into the reactor 45. The surface of the GaAs substrate 1, which is heated at a temperature in the range of 250° C. to 400° C., preferably, at 300° C., is exposed to the $H_2S$ gas or $H_2Se$ gas for 20 minutes. With this operation, a native oxide film formed on the surface of the GaAs substrate 1 is removed. The surface of the GaAs substrate 1 is subjected to passivation by S atoms or Se atoms. The step of exposing the surface of the GaAs substrate 1 to the $H_2S$ gas or $H_2Se$ gas may be omitted in the case where the oxide film on the surface of the GaAs substrate 1 is removed by hydrochloric acid and the like, the surface is sufficiently clean, and the interface state is low.

Next, the MgSSe layer 48 which is lattice-matched with the GaAs substrate 1 is grown by using $(C_5H_5)_2Mg$ of an organometallic compound as a group II material gas, $H_2S$ and $H_2Se$ as group VI material gases, and an $H_2$ gas as a carrier gas (FIG. 8B). The MgSSe layer preferably has a thickness in the range of 20 nm to 50 nm. In Example 8, the MgSSe layer 48 having a thickness of 50 nm is formed.

Next, as shown in FIG. 9C, after depositing an AuGe alloy on the back face of the GaAs substrate 1, the GaAs substrate 1 is alloyed in an argon atmosphere at a temperature of 450° C. for 30 seconds to form the ohmic electrode 16. Thereafter, as shown in FIG. 8D, the conductive electrode 17 made of aluminum and having a predetermined pattern is formed on the MgSSe layer 48. Other metals such as titanium, gold and platinum may be used for the conductive electrode 17. Alternatively, a conductive electrode having a multilayered structure which consists of the laminated layers of these metals may be formed. By the above process, the MIS type diode is completed.

According to the fabrication method of the example, passivation is performed on the surface of the GaAs substrate by a monoatomic layer of sulfur or selenium by exposing the GaAs substrate to the $H_2S$ gas or $H_2Se$ gas. Subsequently, by epitaxially growing the MgSSe layer on the surface of the GaAs substrate, the MgSSe layer can be formed while the surface of the GaAs substrate is kept out of contact with oxygen in the atmosphere. Moreover, as shown in FIG. 6, since MgSSe can be lattice-matched with GaAs, the interface state density and the dislocation defect density are remarkably reduced in the vicinity of the surface of GaAs in contact with the MgSSe layer. Moreover, since MgSSe has an energy gap of about 4.4 eV, the MgSSe layer efficiently functions as an insulating layer. Thus, an excellent MIS type device having a remarkably low interface state density and a high breakdown voltage can be obtained.

By the method similar to the above one, an MgS layer can be formed on the surface of the GaAs substrate 1. If $Ca(OCH_3)$ of an alkoxide compound and $(CH_3)_2Zn$ or an organometallic compound as a group II material gas, $H_2S$ as a group VI material gas, and an $H_2$ gas as a carrier gas are used, the CaZnS layer which is lattice-matched with the GaAs substrate can be grown by the MOCVD method.

EXAMPLE 9

Figure 10A:
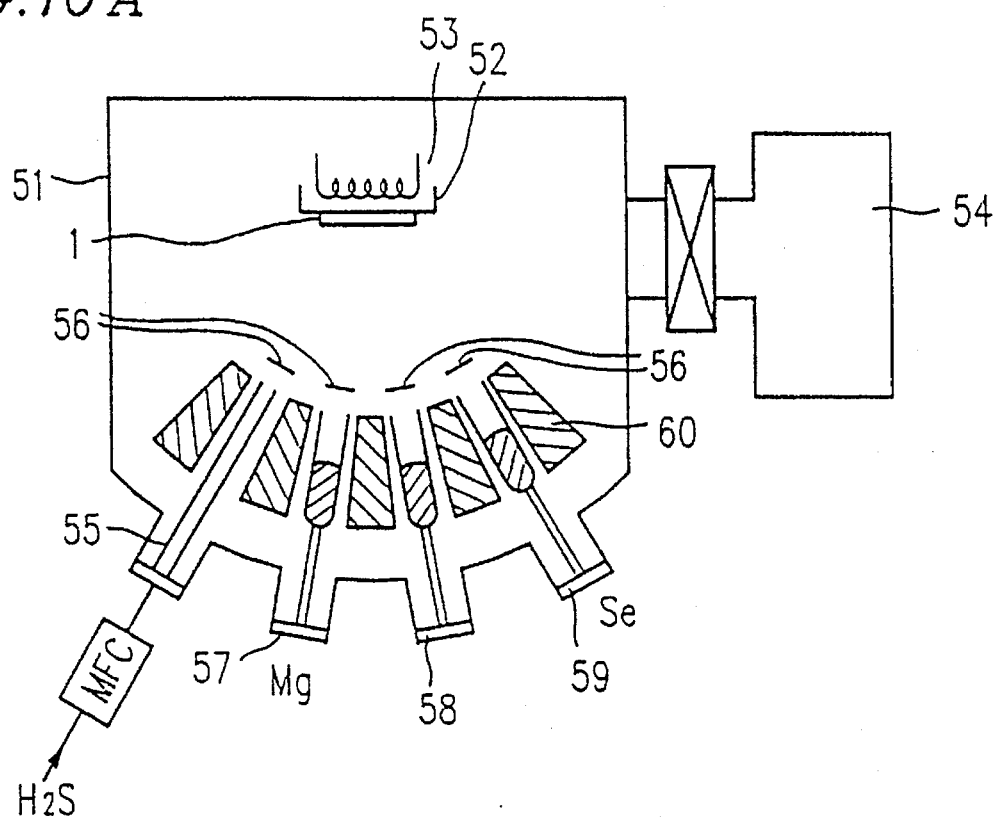
FIGS. 10A through 10C are views showing an MIS type semiconductor device according to Example 9 and a fabrication process for the same.
Figure 10B:
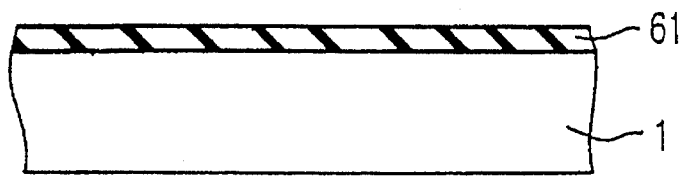
Figure 10C:
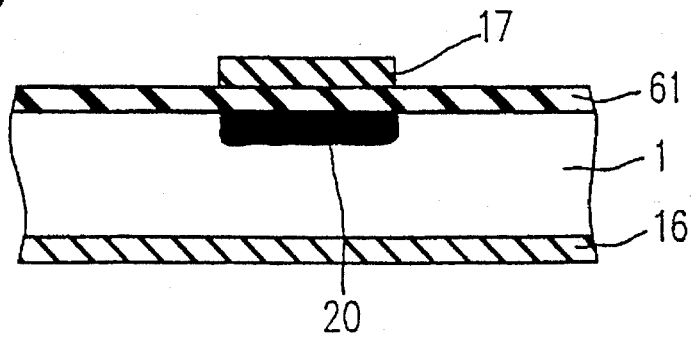

FIG. 10C is a cross-sectional view showing an MIS type diode according to the present invention. The MIS type diode of the present invention includes a GaAs substrate 1, an MgSSe layer 61 formed on the GaAs substrate 1, and a conductive electrode 17 formed on the MgSSe layer 61. An ohmic electrode 16 is formed on the face of GaAs substrate 1 opposite to which the MgSSe layer 61 is formed. An inversion layer 20 is formed in the vicinity of the boundary with the MgSSe layer 61 in the GaAs substrate 1 in accordance with the voltage applied to the conductive electrode 17.

A method for fabricating an MIS diode according to Example 9 will be described with reference to FIGS. 10A to 10C.

AS shown in FIG. 10A, the GaAs substrate 1 is held in a substrate holder 52 which is placed in an ultra-high vacuum chamber 51 of an MBE device. The substrate holder 52 is equipped with a heater 53, so that the GaAs substrate 1 is heated at a desired temperature. The high vacuum state is maintained in the ultra-high vacuum chamber 51 by using an exhaust system 54.

First, a native oxide film formed on the surface of the GaAs substrate 1 is removed by introducing the $H_2S$ gas into the ultra-high vacuum chamber 51 via a thermal decomposition cell 55 and opening a shutter 56 for 15 minutes while maintaining the GaAs substrate at 300° C. by using the heater 53. As a result, passivation is performed on the surface of the GaAs substrate 1 by S atoms. The passivation may be performed on the surface of the GaAs substrate 1 by Se atoms, using an H₂Se gas instead of the H₂S gas. It is sufficient to heat the GaAs substrate 1 at a temperature in a range of 250° C. to 400° C. The step of exposing the surface of the GaAs substrate 1 to the H₂S gas or H₂Se may be omitted in the case where the oxide film on the surface of the GaAs substrate 1 is removed by hydrochloric acid and the like, the surface is sufficiently clean, and the interface state is low.

Next, as shown in FIG. 10B, an MgSSe layer 61 is epitaxially grown on the GaAs substrate 1 by using molecular beam cells 57, 58 and 59 for solid-state sources Mg, S, and Se, respectively. The MgSSe layer 61 preferably has a thickness in the range of 20 nm to 50 nm. In Example 9, the MgSSe layer 61 having a thickness of 50 nm is formed. Liquid nitride shrouds 60 are provided for the respective portions between the cells so that the molecular beam cells 56 to 58 and the heat radiated by the thermal decomposition cell 55 do not affect each other.

Thereafter, as shown in FIG. 10C, after depositing an AuGe alloy on the opposite face of the GaAs substrate 1, the GaAs substrate is alloyed in an argon atmosphere at a temperature of 450° C. for 30 seconds to form the ohmic electrode 16. Thereafter, the conductive electrode 17 made of aluminum and having a predetermined pattern is formed on the MgSSe layer 61. Other metals such as titanium, gold and platinum may be used for the conductive electrode 17. Alternatively, a conductive electrode having a multilayered structure which consists of the laminated layers of these metals may be formed. By the above process, the MIS type diode is completed.

According to the fabrication method of the example, passivation is performed on the surface of the GaAs substrate by sulfur of a monoatomic layer by exposing the GaAs substrate to the H₂S gas. Subsequently, by epitaxially growing the MgSSe layer on the surface of the GaAs substrate, the MgSSe film can be formed while the surface of the GaAs substrate is kept out of contact with oxygen in the atmosphere. Moreover, as shown in FIG. 6, since MgSSe can be lattice-matched with GaAs, the interface state density and the dislocation defect density are remarkably reduced in the vicinity of the surface of GaAs in contact with the MgSSe film. Moreover, since MgSSe has an energy gap of about 4.4 eV, the MgSSe film efficiently functions as an insulating layer. Thus, an excellent MIS type device having a remarkably low interface state density and a high breakdown voltage can be obtained.

By the method similar to the above one, an MgS layer can be formed on the GaAs substrate 1.

Diode characteristic

Figure 11:
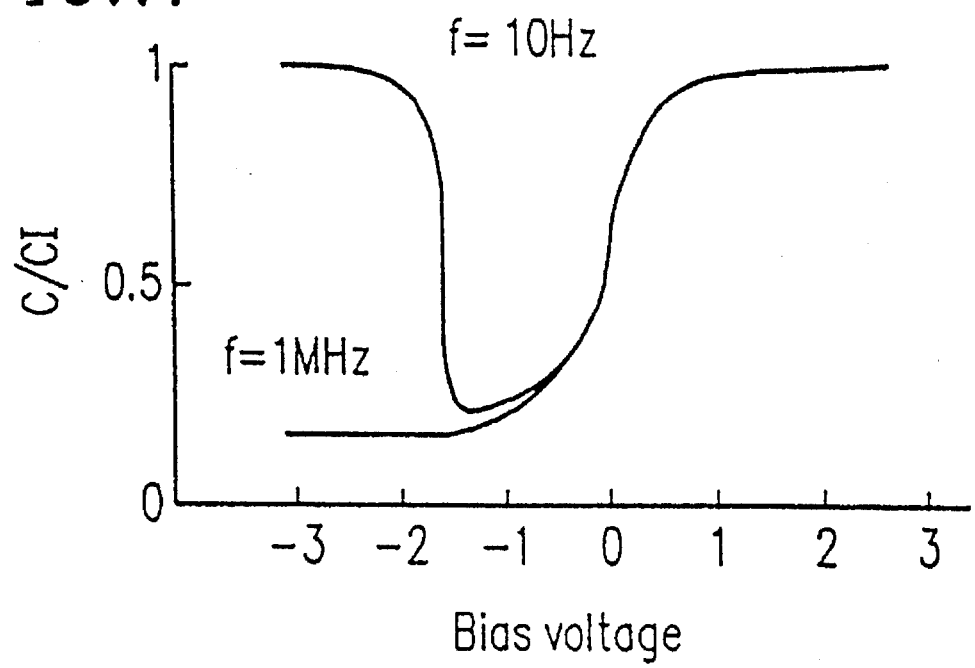
FIG. 11 is a graph showing the C-V characteristic of an MIS type diode of the present invention.

The MIS type diodes, which are fabricated in Examples 1 through 9 described above, exhibit excellent characteristics. As a typical example, the characteristic of the MIS diode fabricated according to Example 9 is shown. FIG. 11 shows C-V (capacitance-voltage) characteristics at a high-frequency (1 MHz) and a low frequency (10 Hz) of the MIS diode fabricated according to Example 9. The vertical axis is normalized by the insulating layer capacitance CI. As is apparent from FIG. 11, the MIS diode has the breakdown voltage of about ±3 V. An accumulation region formed in the GaAs semiconductor layer is suddenly changed into a depletion region in accordance with change in the applied voltage. Moreover, it is confirmed that a GaAs inversion layer is formed.

Also with the MIS diodes according to the other examples, the C-V characteristic similar to that of FIG. 11 is obtained, and the formation of the GaAs inversion layer is confirmed.

Figure 12:
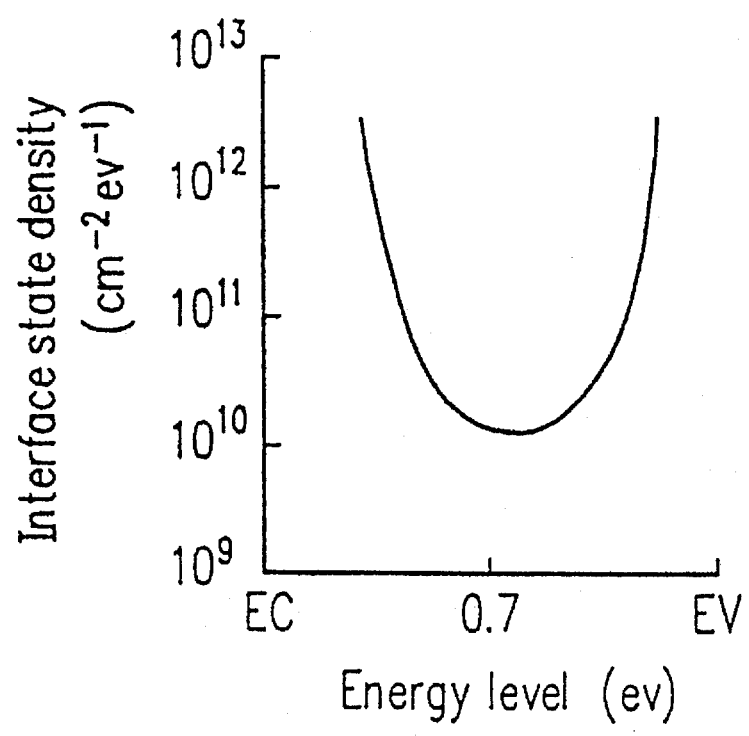
FIG. 12 is a graph showing an interface state density for an MIS type diode of the present invention.

FIG. 12 shows the interface state density distribution which is obtained with respect to the sample of FIG. 11. The minimum interface state density distribution is in the order of $10^{10}$ cm$^{-2}$eV$^{-1}$, and therefore is extremely low. The interface state density distribution shows that an excellent interface state characteristic is obtained. With the MIS diodes according to the other examples, the minimum interface state density distribution in the order of about $10^{10}$ cm$^{-2}$eV$^{-1}$ which is similar to FIG. 12. Moreover, it is confirmed that the MIS diodes exhibit excellent interface characteristics.

Fabrication of a three-terminal device

FIGS. 13A through 13F shows a method for fabricating a three-terminal device (complementary MISFET) including an MIS type diode which is fabricated by using any one of the methods described in Examples 1 through 9.

Figure 13A:
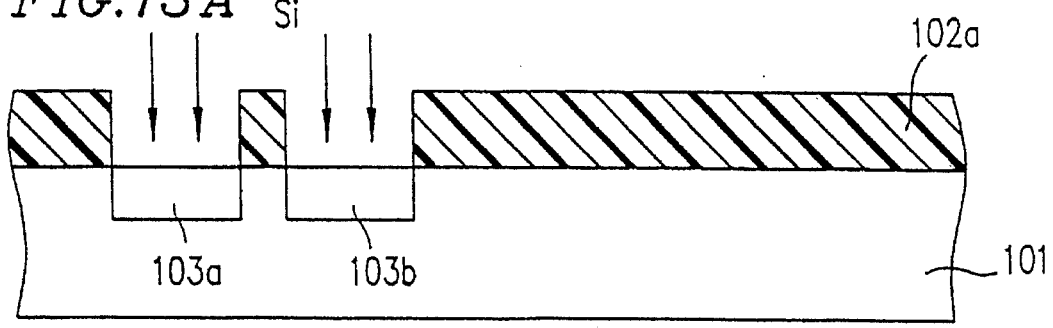
FIGS. 13A through 13F are cross-sectional views showing a complementary MISFET and a fabrication method for the same according to the present invention.

As shown in FIG. 13A, after forming a photoresist film 102a on a semi-insulating GaAs substrate 101, Si ions are implanted into the semi-insulating GaAs substrate 101, using the photoresist film 102a as a mask so as to form an n⁺-type source region 103a and an n⁺-type drain region 103b. In this case, the implantation energy is 40 keV, and the dose amount is 5×10$^{14}$ cm$^{-2}$.

Figure 13B:
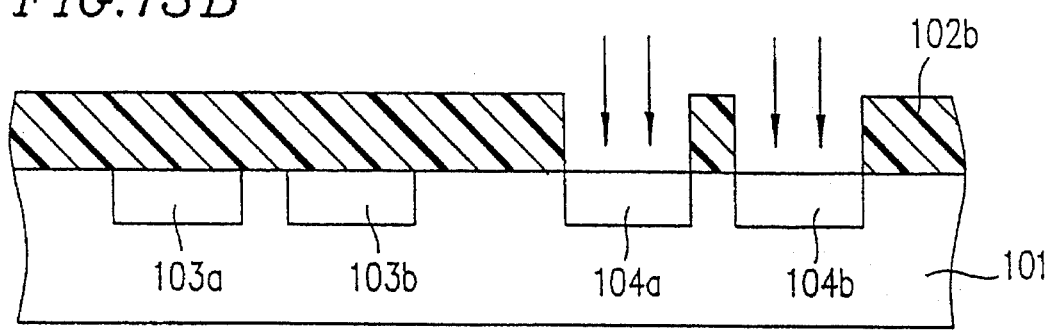

After removing the photoresist film 102a, as shown in FIG. 13B, a photoresist film 102b is formed on the semi-insulating substrate 101. Thereafter, Mg ions are implanted into the semi-insulating GaAs substrate 101, using the photoresist film 102b as a mask so as to form a p⁺-type source region 104a and a p⁺-type drain region 104b. In this case, the implantation energy is 30 keV, and the dose amount is 5×10$^{14}$ cm$^{-2}$.

Figure 13C:
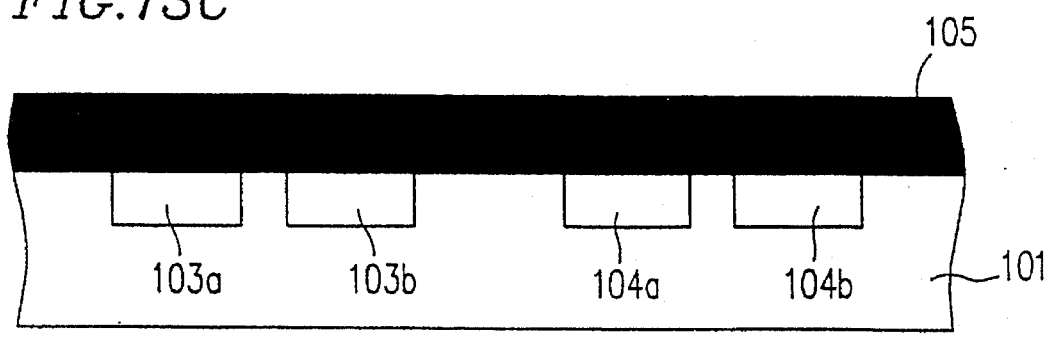
Figure 13D:
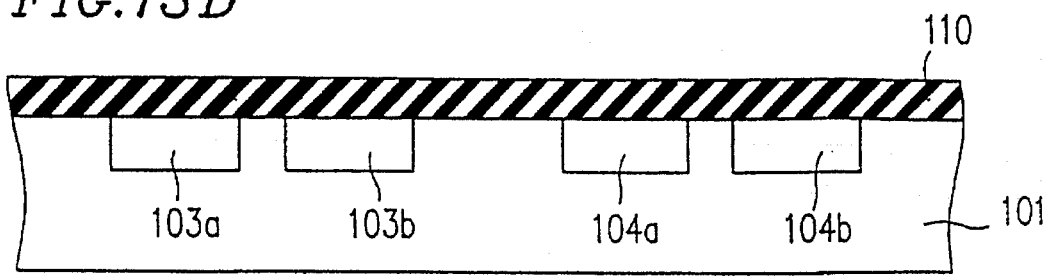

As shown in FIG. 13C, after forming an SiO₂ film 105 (thickness: 150 nm) on the entire surface of the GaAs substrate 101 at 400° C. by using a CVD method, rapid thermal anneal (RTA) is performed on the GaAs substrate 101 at 850° C. for 10 seconds so as to activate the n⁺-type source region 103a, the n⁺-type drain region 103b, the p⁺-type source region 104a and the p⁺-type drain region 104b. After removing the SiO₂ film by hydrofluoric acid, as shown in FIG. 13D, the surface of the semi-insulating GaAs substrate 101 is treated with an H₂S gas by using an MBE device by the procedure of Example 9. Thereafter, an MgSSe layer 110 (thickness: 50 nm) is grown on the semi-insulating GaAs substrate 101.

Figure 13E:
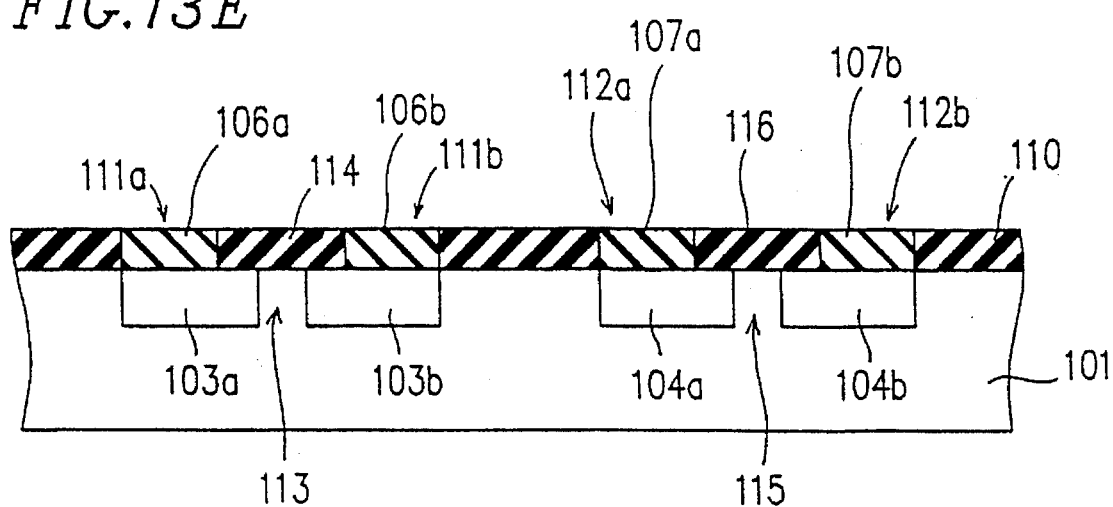

As shown in FIG. 13E, part of the MgSSe layer 110 is etched with a chlorine gas (Cl₂) so that the surfaces of the n⁺-type source region 103a, the n⁺-type drain region 103b, the p⁺-type source region 104a and the p⁺-type drain region 104b are exposed. As a result, contact holes 111a, 111b, 112a and 112b are provided in the MgSSe layer 110. Parts of the MgSSe layer 110, which are positioned on a region 113 between the n⁺-type source region 103a and the n⁺-type drain region 103b and a region 115 between the p⁺-type source region 104a and the p⁺-type drain region 104b, function as gate insulating films 114 and 116, respectively.

By using a lift-off method, AuGe alloy layers (not shown) are formed on the n⁺-type source region 103a and the n⁺-type drain region 103b in the contact holes 111a and 111b, and AuZn alloy layers (not shown) are formed on the p⁺-type source region 104a and the p⁺-type drain region 104b in the contact holes 112a and 112b. Subsequently, the rapid thermal anneal (RTA) is performed on the semi-insulating GaAs substrate 101 at 400° C. for 10 seconds so that ohmic contacts between the alloy layers and the semi-insulating GaAs substrate 101 are formed, thereby forming an n-type source electrode 106a, an n-type drain electrode 106b, a p-type source electrode 107a and a p-type drain electrode 107b on the n$^+$-type source region 103a, the n$^+$-type drain region 103b, the p$^+$-type source region 104a and the p$^+$-type drain region 104b, respectively.

Figure 13F:
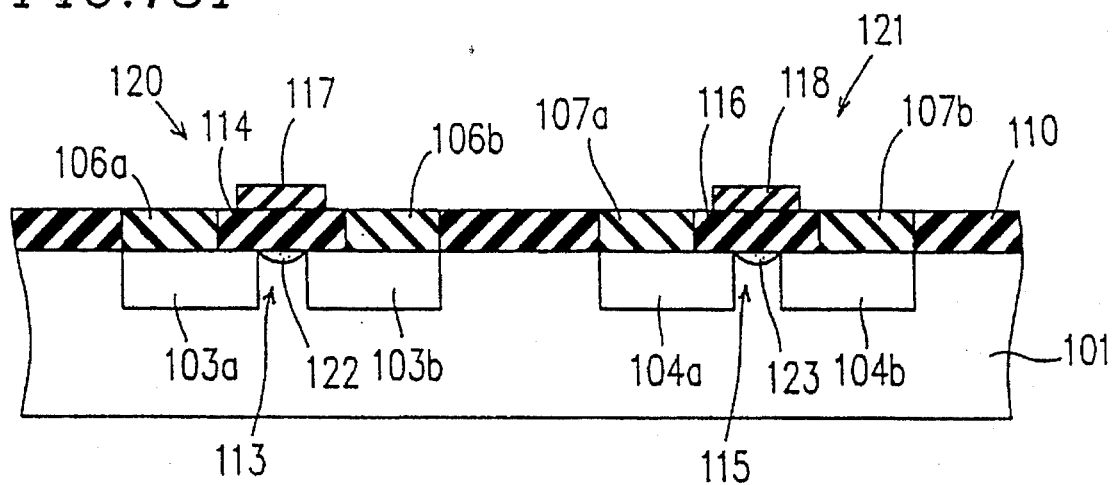

As a final step, as shown in FIG. 13F, gate electrodes 117 and 118 made of aluminum are formed on the respective gate insulating films 114 and 116 by using the lift-off method, thereby completing an n-type MISFET 120 and a p-type MISFET 121.

Although not shown in the figures, a complementary FET integrated circuit may be formed by connecting electrodes of the n-type MISFET 120 and the p-type MISFET 121 to each other as the next step.

In the n-type MISFET 120, the region 113 of the semi-insulating GaAs substrate 101, the gate insulating film 114 provided on the region 113 and the gate electrode 117 provided on the gate insulating film 114 constitute an MIS-type structure. In accordance with the voltage applied to the gate electrode 117, an inversion layer 122 is formed in the vicinity of the boundary with the gate insulating film 114 of the region 113. Therefore, the n-type source electrode 106a and the n-type drain electrode 106b can be electrically connected with each other through the inversion layer 122, and the n$^+$-type source region 103a and the n$^+$-type drain region 103b which interpose the inversion layer 122 therebetween.

With this configuration, whether the inversion layer 122 is formed or not and the carrier density in the inversion layer 122 are controlled in accordance with the voltage applied to the gate electrode 117. As a result, the n-type MISFET functions as a transistor for controlling the current flowing across the n-type source electrode 106a and the n-type drain electrode 106b.

In the case where an inversion layer 123 is similarly formed in the p-type MISFET 121, the p-type MISFET 121 functions as an MIS type transistor.

Since the MIS type transistor of the present invention uses a GaAs substrate having an electron mobility about 5 times that of silicon and has the MIS type structure, the MIS type transistor operates at high speed with low power consumption.

In the above example, the MgSSe layer is described as a material of the insulating layer of MISFET. However, an MgS layer or a CaZnS layer may also be used. Moreover, although the insulating layer is formed by the MBE method, any one of the methods described in Example 1 to 9 may also be used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:

a GaAs semiconductor substrate;

an insulating layer which is made of material consisting essentially of MgS, MgSSe or CaZnS and is formed on the GaAs substrate; and a conductive electrode formed on the insulating layer.

2. The semiconductor device according to claim 1, wherein an inversion layer is formed in the GaAs semiconductor substrate in accordance with a voltage applied to the conductive electrode.

3. The semiconductor device according to claim 1, further comprising a source electrode and a drain electrode formed on the GaAs semiconductor substrate, wherein an inversion layer is formed in the GaAs semiconductor substrate and a current flows across the source electrode and the drain electrode through the inversion layer.

4. A semiconductor device comprising:

a GaAs semiconductor substrate having a surface, the surface being covered with a passivation layer which contains at least one of sulfur and selenium and has a thickness of at least one atomic layer;

an insulating layer which is made of material consisting essentially of MgS, MgSSe, or CaZnS and is formed on the surface of the GaAs semiconductor substrate; and a conductive electrode formed on the insulating layer.

5. The semiconductor device according to claim 3, wherein an inversion layer is formed in the GaAs semiconductor substrate in accordance with a voltage applied to the conductive electrode.

6. The semiconductor device according to claim 4, further comprising a source electrode and a drain electrode formed on the GaAs semiconductor substrate, wherein a current flows across the source electrode and the drain electrode through the inversion layer.

* * * * *